(12) United States Patent
Shindo et al.

(10) Patent No.: US 11,335,586 B2
(45) Date of Patent: May 17, 2022

(54) TRANSFER DEVICE

(71) Applicant: TOKYO ELECTRON LIMITED, Tokyo (JP)

(72) Inventors: Takehiro Shindo, Yamanashi (JP); Shinji Wakabayashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/211,347

(22) Filed: Mar. 24, 2021

(65) Prior Publication Data

US 2021/0305081 A1    Sep. 30, 2021

(30) Foreign Application Priority Data

Mar. 30, 2020 (JP) .............................. JP2020-060455

(51) Int. Cl.
*H01L 21/00* (2006.01)
*H01L 21/683* (2006.01)
*H01L 21/67* (2006.01)

(52) U.S. Cl.
CPC .... *H01L 21/6838* (2013.01); *H01L 21/67126* (2013.01); *H01L 21/67196* (2013.01); *Y10T 156/1132* (2015.01); *Y10T 156/1944* (2015.01)

(58) Field of Classification Search
CPC ........... H10L 21/6863; Y10T 156/1132; Y10T 156/1944
See application file for complete search history.

(56) References Cited

U.S. PATENT DOCUMENTS

| 5,929,456 | A | * | 7/1999 | Tamai | ..................... C23C 14/56 250/492.21 |
| 6,313,469 | B1 | * | 11/2001 | Tamai | ............... H01L 21/67213 250/441.11 |
| 2004/0114994 | A1 | * | 6/2004 | Tsutsumi | ............. H01R 39/643 403/164 |
| 2010/0178135 | A1 | * | 7/2010 | Laceky | ................ B25J 19/0029 414/217 |

FOREIGN PATENT DOCUMENTS

JP    H06-035737 U    5/1994

* cited by examiner

*Primary Examiner* — Philip C Tucker
*Assistant Examiner* — Nickolas R Harm
(74) *Attorney, Agent, or Firm* — Fenwick & West LLP

(57) ABSTRACT

A transfer device is disposed in a vacuum transfer chamber. The transfer device includes a structure body having an inner space isolated from the vacuum transfer chamber, an arm that rotates with respect to the structure body, and a vacuum seal structure configured to airtightly seal a sliding portion between the structure body and the arm. Further, the vacuum seal structure includes one or more seal members disposed at the sliding portion; a sealing portion formed by the structure body, the arm, and the seal members, lubricant being sealed in the sealing portion; and a pressure adjusting unit configured to adjust a pressure in the sealing portion.

16 Claims, 3 Drawing Sheets

TRANSFER DEVICE

CROSS-REFERENCE TO RELATED APPLICATIONS

This application claims priority to Japanese Patent Application No. 2020-060455, filed on Mar. 30, 2020, the entire contents of which are incorporated herein by reference.

TECHNICAL FIELD

The present disclosure relates to a transfer device.

BACKGROUND

There is known a vacuum seal structure in which a packing holder, through which a rotating and linearly reciprocating shaft penetrates, is attached to a vacuum container; a plurality of packings is stored in an inner peripheral portion of the packing holder; and a ring-shaped grease reservoir is disposed between adjacent packings (see, e.g., Japanese Utility Model Publication No. H06-35737).

SUMMARY

The present disclosure provides a technique capable of suppressing unstable operation of a transfer device.

In accordance with an aspect of the present disclosure, there is provided a transfer device disposed in a vacuum transfer chamber, including: a structure body having an inner space isolated from the vacuum transfer chamber; an arm that rotates with respect to the structure body; and a vacuum seal structure configured to airtightly seal a sliding portion between the structure body and the arm. The vacuum seal structure includes: one or more seal members disposed at the sliding portion; a sealing portion formed by the structure body, the arm, and the seal members, lubricant being sealed in the sealing portion; and a pressure adjusting unit configured to adjust a pressure in the sealing portion.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
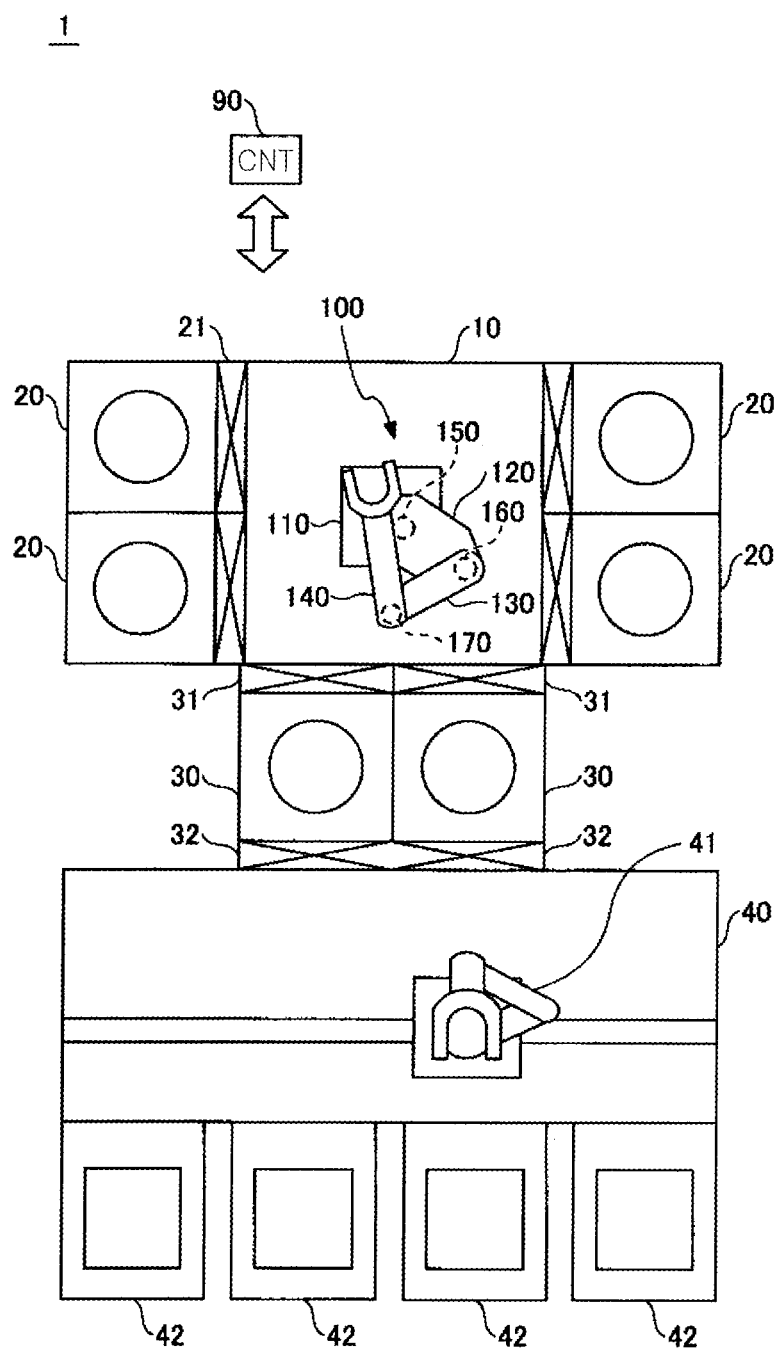
FIG. 1 shows an example of a processing system of an embodiment.

Hereinafter, non-limiting exemplary embodiments will be described in detail with reference to the accompanying drawings. Like reference numerals will be given to like or corresponding parts throughout the drawings, and redundant description thereof will be omitted.

(Processing System)

A processing system according to an embodiment will be described with reference to FIG. 1. FIG. 1 shows an example of the processing system according to the embodiment. In FIG. 1, internal components are illustrated transparently for easier understanding.

The processing system 1 includes a vacuum transfer chamber 10, a plurality of process chambers 20, a plurality of load-lock chambers 30, a loader module 40, and a controller (CNT) 90.

The vacuum transfer chamber 10 is maintained at a predetermined vacuum level. The plurality of process chambers 20 and the plurality of load-lock chambers 30 are connected to the vacuum transfer chamber 10. In the present embodiment, four process chambers 20 are connected to the vacuum transfer chamber 10. However, three or less process chambers 20 may be connected to the vacuum transfer chamber 10, or five or more process chambers 20 may be connected to the vacuum transfer chamber 10. Further, in the present embodiment, two load-lock chambers 30 are connected to the vacuum transfer chamber 10. However, one load-lock chamber 30 may be connected to the vacuum transfer chamber 10, or three or more load-lock chambers 30 may be connected to the vacuum transfer chamber 10. Further, a transfer device 100 is disposed in the vacuum transfer chamber 10.

The transfer device 100 extracts an unprocessed substrate from the load-lock chamber 30 in which a pressure is reduced to a predetermined vacuum level and transfers the unprocessed substrate into one of the process chambers 20. Further, the transfer device 100 extracts a processed substrate from the process chamber 20 and transfers the processed substrate into another process chamber 20 or the load-lock chamber 30. In the present embodiment, the substrate is a semiconductor wafer.

In the present embodiment, the transfer device 100 has a base 110, a base arm 120, an intermediate arm 130, and a tip end arm 140. The transfer device 100 transfers a substrate held on the tip end arm 140. A vacuum seal structure 150 is provided between the base 110 and the base arm 120; a vacuum seal structure 160 is provided between the base arm 120 and the intermediate arm 130; and a vacuum seal structure 170 is provided between the intermediate arm 130 and the tip end arm 140. The vacuum seal structures 150, 160, and 170 function as joints and are connected to driving motors to be rotatably (revolvably) driven by driving motors disposed at the joints. In the present embodiment, the transfer device 100 has three joints that can be driven independently. However, for example, the transfer device 100 may have four or more joints that can be driven independently, or may have two joints that can be driven independently. Further, the transfer device 100 may have one joint.

The process chamber 20 is configured to perform processing such as etching or film formation on the substrate in a low-pressure environment, for example. The process chamber 20 is partitioned from the vacuum transfer chamber 10 by an openable and closable gate valve 21. The process chamber 20 is an example of a processing chamber. The process chambers 20 may be modules that execute the same process or different processes in a manufacturing process.

Each of the load-lock chambers 30 has doors 31 and 32. Each load-lock chamber 30 is configured such that a pressure therein is switched from a predetermined vacuum level to an atmospheric pressure or from an atmospheric pressure to a predetermined vacuum level. Each load-lock chamber 30 is partitioned from the vacuum transfer chamber 10 by the openable and closable door 31. Further, each load-lock chamber 30 is partitioned from the loader module 40 by the openable and closable door 32.

The loader module 40 is connected to the load-lock chambers 30. A transfer device 41 is disposed in the loader module 40. The loader module 40 is provided with a plurality of load ports 42 each of which is to be connected to a container (e.g., a Front Opening Unified Pod (FOUP)) capable of accommodating a plurality of unprocessed or processed substrates. In the present embodiment, the transfer device 41 has three joints that can be driven independently. However, the transfer device 41 may have four or more joints that can be driven independently, or may have two joints that can be driven independently. Further, the transfer device 41 may have one joint. The transfer device 41 extracts an unprocessed substrate from the container connected to the load port 42 and transfers the unprocessed substrate into the load-lock chamber 30. Further, the transfer device 41 extracts a processed substrate from the load-lock chamber 30 in which an inner pressure is returned to the atmospheric pressure, and transfers the processed substrate into the container connected to the load port 42. The loader module 40 may be provided with an aligner (not shown) for adjusting the orientation of the substrate extracted from the container connected to the load port 42.

The controller 90 controls the operations of the respective components of the processing system 1. The controller 90 may be, e.g., a computer or the like. Further, a program of the computer for controlling the operations of the respective components of the processing system 1 is stored in a storage medium. The storage medium may be, e.g., a flexible disk, a compact disk, a hard disk, a flash memory, a digital versatile disc (DVD), or the like.

(Transfer Device)

Figure 2:
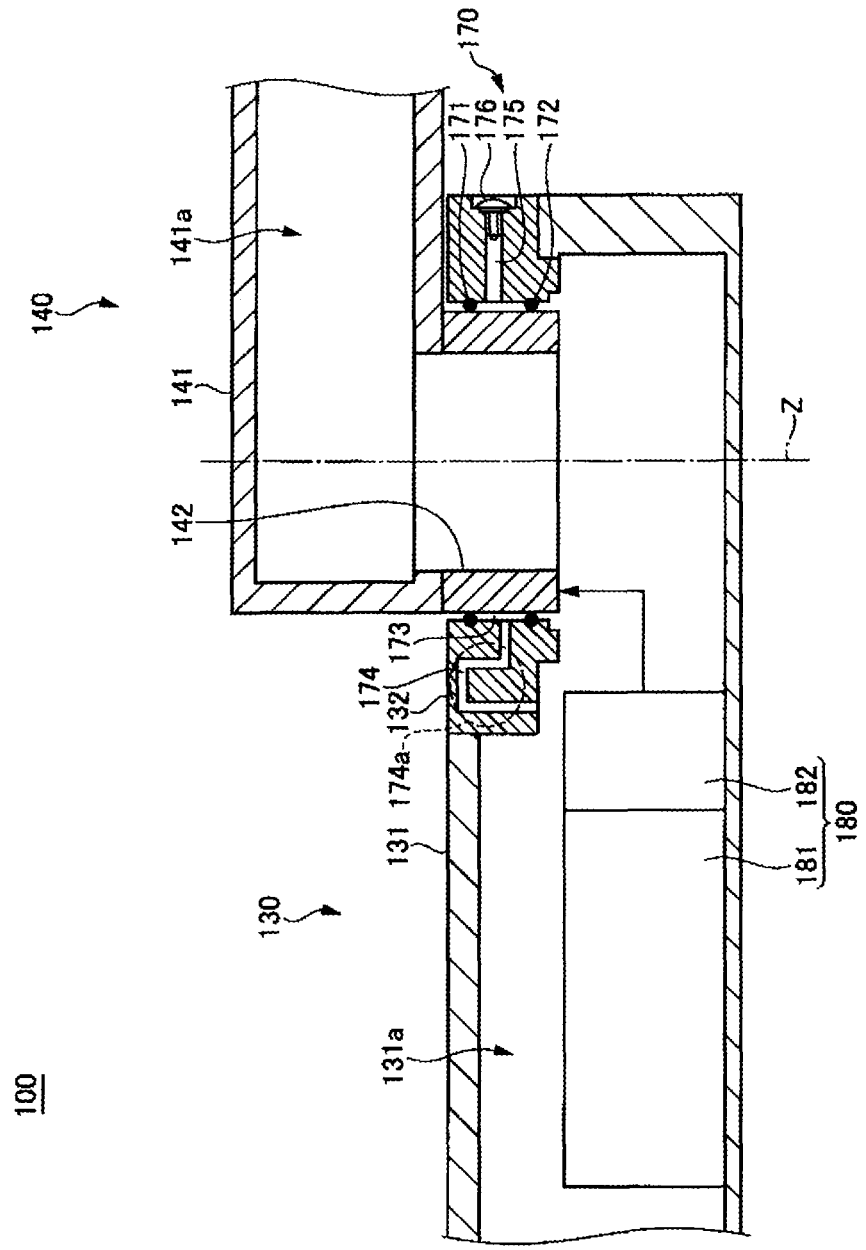
FIG. 2 shows an example of a transfer device according to an embodiment.

An example of a transfer device according to the embodiment will be described with reference to FIG. 2. FIG. 2 shows an example of the transfer device according to the embodiment and illustrates a partial cross section of the transfer device. Hereinafter, the vacuum seal structure 170 will be described as an example, but the vacuum seal structures 150 and 160 may have the same configuration as that of the vacuum seal structure 170.

The transfer device 100 has the intermediate arm 130, the tip end arm 140, the vacuum seal structure 170, and a driving unit 180.

The intermediate arm 130 includes a main body 131 and a support 132. The main body 131 is formed in a hollow plate shape, and includes an inner space 131a isolated from the vacuum transfer chamber 10. The inner space 131a may be maintained in, e.g., an atmospheric environment. The support 132 has a substantially cylindrical shape and is connected to an upper portion on a tip end of the main body 131. The main body 131 and the support 132 are made of a metal such as aluminum (Al) or the like.

The tip end arm 140 includes a main body 141 and a rotating body 142. The main body 141 is formed in a hollow plate shape, and includes an inner space 141a isolated from the vacuum transfer chamber 10. The inner space 141a communicates with the inner space 131a of the intermediate arm 130. Further, the inner space 141a may be maintained in, e.g., an atmospheric environment. The rotating body 142 is connected to a lower portion of a base end of the main body 141. The rotating body 142 has a substantially cylindrical shape having an outer diameter that is substantially the same as an inner diameter of the support 132. The rotating body 142 is slidably disposed at a radially inner side of the support 132 and rotates (revolves) with respect to the support 132. The main body 141 and the rotating body 142 are made of a metal such as Al or the like.

The vacuum seal structure 170 airtightly seals off the inner spaces 131a and 141a from the vacuum transfer chamber 10 when the tip end arm 140 rotates (revolves) with respect to the intermediate arm 130. The vacuum seal structure 170 includes a first seal member 171, a second seal member 172, a sealing portion 173, a first communication passage 174, a second communication passage 175, and a cap member 176.

The first seal member 171 is disposed at a sliding portion between the support 132 and the rotating body 142, and airtightly seals the sliding portion. The first seal member 171 may be, e.g., an O-ring.

The second seal member 172 is disposed at the sliding portion between the support 132 and the rotating body 142, and airtightly seals the sliding portion. The second seal member 172 is disposed below the first seal member 171 in a vertical direction with a gap therebetween. The second seal member 172 may be, e.g., an O-ring.

The sealing portion 173 is formed by the support 132, the rotating body 142, the first sealing member 171, and the second sealing member 172. Lubricant such as vacuum grease or the like is sealed in the sealing portion 173. Since lubrication between the support 132 and the first and second seal members 171 and 172 and between the rotating body 142 and the first and second seal members 171 and 172 is realized by the lubricant, the erosion of the seal member 171 and the second seal member 172 is reduced. Accordingly, the lifespans of the first seal member 171 and the second seal member 172 are increased.

The first communication passage 174 has one end communicating with the sealing portion 173 and the other end communicating with the inner space 131a. In other words, the sealing portion 173 communicates with the inner space 131a through the first communication passage 174. When an inner pressure of the sealing portion 172 increases due to the change in the vacuum level of the vacuum transfer chamber 10 or the change in the temperature of the sliding portion, the lubricant sealed in the sealing portion 173 is released to the first communication passage 174 to reduce the pressure in the sealing portion 173. Therefore, it is possible to prevent the operation of the tip end arm 140 with respect to the intermediate arm 130 from becoming unstable due to the variation in a pressing force against the rotating body 142 caused by the increase in the inner pressure of the sealing portion 173. Further, in a case where a position of the other end of the first communication passage 174 is lower than the sealing portion 173, it is preferable that the first communication passage 174 includes a folded portion 174a that is folded up in the vertical direction. Accordingly, the lubricant that has moved from the sealing portion 173 to the first communication passage 174 can be prevented from leaking into the inner space 131a. In order to prevent the leakage of the lubricant, it is preferable that at least a part of the folded portion 174a is disposed above an upper end of the sealing portion 173.

The second communication passage 175 has one end communicating with the sealing portion 173 and the other end communicating with the inside of the vacuum transfer chamber 10. The second communication passage 175 functions as a port for replenishing the lubricant in the sealing portion 173 or replacing the lubricant sealed in the sealing portion 173.

The cap member 176 is detachably disposed at the other end of the second communication passage 175. The cap member 176 is, e.g., a screw, and airtightly closes the other end of the second communication passage 175. The cap member 176 is removed when the lubricant is replenished in the sealing portion 173 or the lubricant sealed in the sealing portion 173 is replaced.

The driving unit 180 is disposed in the inner space 131a, and rotates (revolves) the tip end arm 140 with respect to the intermediate arm 130. The driving unit 180 includes a driving motor 181 and a transmission unit 182.

The driving motor 181 is disposed in the inner space 131a. The driving motor 181 may be, e.g., a servo motor or a stepper motor.

The transmission unit 182 transmits the rotation of the driving motor 181 to the rotating body 142 to rotate the rotating body 142 about the vertical axis (Z-axis). Accordingly, the tip end arm 140 rotates (revolves) with respect to the intermediate arm 130. The transmission unit 182 may be, e.g., a combination of a plurality of gears, or a combination of a belt and a pulley.

As described above, the transfer device 100 of the embodiment has the vacuum seal structure 170 including the first communication passage 174 that adjusts the inner pressure of the sealing portion 173 where the lubricant is sealed. Therefore, when the inner pressure of the sealing portion 173 increases due to the change in the vacuum level of the vacuum transfer chamber 10 or the change in the temperature of the sliding portion, the lubricant sealed in the sealing portion 173 is released to the first communication passage 174 to reduce the pressure in the sealing portion 173. Accordingly, it is possible to prevent the operation of the tip end arm 140 with respect to the intermediate arm 130 from becoming unstable due to the variation in the pressing force against the rotating body 142 caused by the increase in the inner pressure of the sealing portion 173. In this manner, the temperature dependence of the transfer device 100 on the operating characteristics can be reduced. As a result, the transfer accuracy or the reliability of the transfer device 100 are improved. In addition, the transfer speed can be increased.

In the transfer device 100, the intermediate arm 130 is an example of a structure body; the tip end arm 140 is an example of an arm; and the first communication passage 174 is an example of a pressure adjusting unit.

Figure 3:
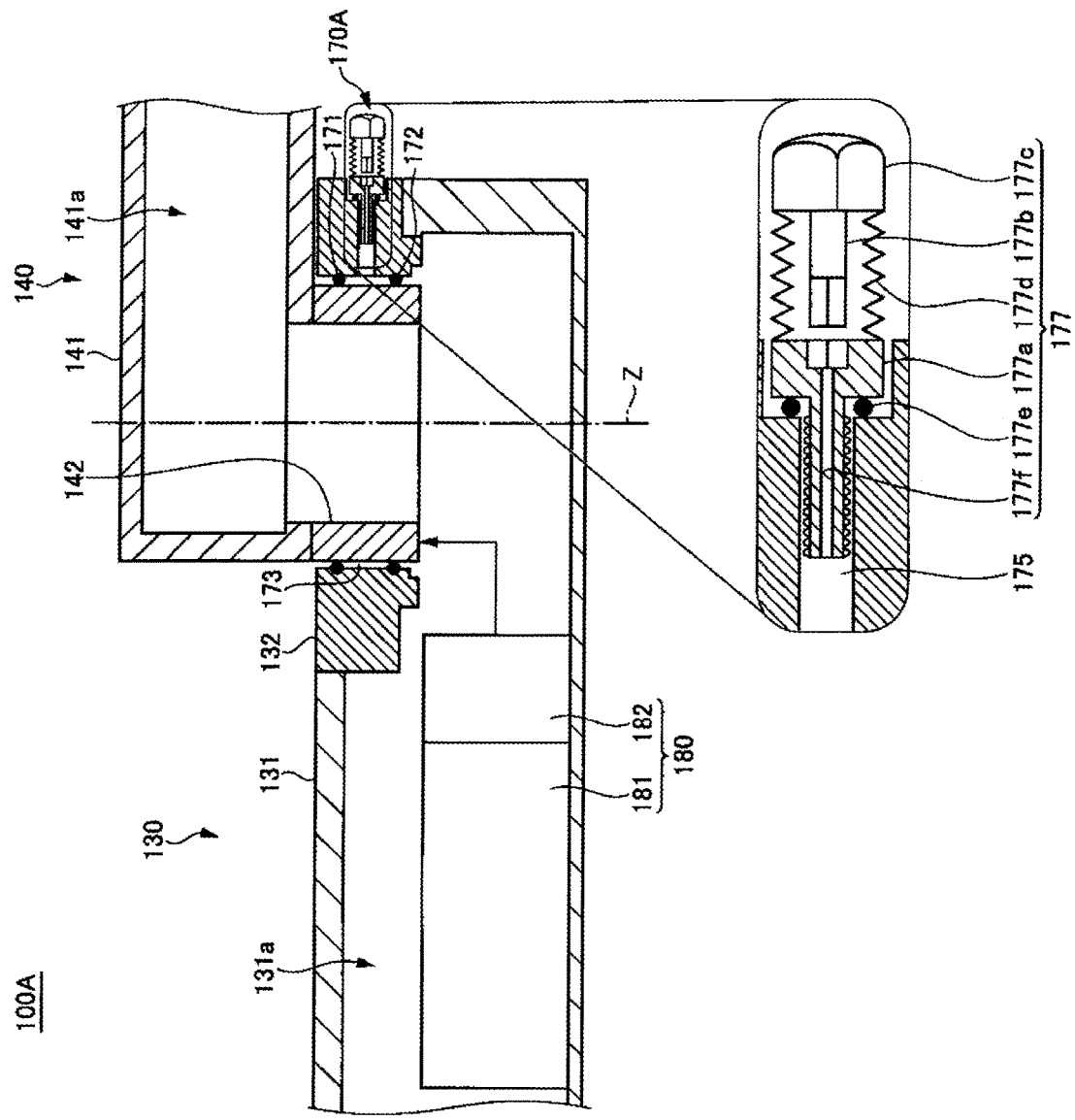
FIG. 3 shows another example of the transfer device of the embodiment.

Another example of the transfer device according to the embodiment will be described with reference to FIG. 3. FIG. 3 shows another example of the transfer device according to the embodiment, and illustrates a partial cross section of the transfer device. A transfer device 100A shown in FIG. 3 is different from the transfer device 100 in that the transfer device 100A includes a vacuum seal structure 170A instead of the vacuum seal structure 170. Since the other configurations are the same as those of the transfer device 100, the configurations that are different from those of the transfer device 100 will be mainly described.

The vacuum seal structure 170A airtightly seals off the inner spaces 131a and 141a from the vacuum transfer chamber 10 when the tip end arm 140 rotates (revolves) with respect to the intermediate arm 130. The vacuum seal structure 170A includes a first seal member 171, a second seal member 172, a sealing portion 173, a second communication passage 175, and a volume adjusting unit 177.

The volume adjusting unit 177 is disposed at the other end of the second communication passage 175 to adjust the volume of the second communication passage 175. The volume adjusting unit 177 includes a cap member 177a, a shaft body 177b, a head 177c, and a bellows 177d. The shaft body 177b, the head 177c, and the bellows 177d serves as an extensible/contractible unit.

The cap member 177a is detachably attached to the other end of the second communication passage 175 via a seal member 177e such as an O-ring or the like. The cap member 177a is, e.g., a screw, and airtightly closes the other end of the second communication passage 175. The cap member 177a is removed when the lubricant is replenished in the sealing portion 173 or when the lubricant sealed in the sealing portion 173 is replaced. A through-hole 177f is formed in the cap member 177a.

One end of the shaft body 177b is inserted into the through-hole 177f. By rotating the shaft body 177b in a state where the shaft body 177b is inserted into the through-hole 177f, the cap member 177a is rotated together with the shaft body 177b. Accordingly, the cap member 177a can be attached to and detached from the second communication passage 175.

The head 177c is connected to the other end of the shaft body 177b.

The bellows 177d is extensible and contractible, and has one end connected to the cap member 177a and the other end connected to the head 177c. The bellows 177d encloses the shaft body 177b.

In the volume adjusting unit 177, when the inner pressure of the sealing portion 173 increases, the bellows 177d is extended to release the lubricant sealed in the sealing portion 173 to the region enclosed by the bellows 177d so that the pressure in the sealing portion 173 can be reduced. Accordingly, it is possible to prevent the operation of the tip end arm 140 with respect to the intermediate arm 130 from becoming unstable due to the variation in the pressing force against the rotating body 142 caused by the increase in the inner pressure of the sealing portion 173.

As described above, the transfer device 100A of the embodiment includes the vacuum seal structure 170A including the second communication passage 175 and the volume adjusting unit 177 that adjust the pressure in the sealing portion 173 where the lubricant is sealed. Therefore, in a case where the inner pressure of the sealing portion 173 increases due to the change in the vacuum level of the vacuum transfer chamber 10 or the change in the temperature of the sliding portion, the lubricant sealed in the sealing portion 173 can be released to the volume adjusting unit 177 to reduce the pressure in the sealing portion 173. Accordingly, it is possible to prevent the operation of the tip end arm 140 with respect to the intermediate arm 130 from becoming unstable due to the variation in the pressing force against the rotating body 142 caused by the increase in inner pressure of the sealing portion 173. In this manner, the temperature dependence of the transfer device 100A on the operating characteristics can be reduced. As a result, the transfer accuracy or the reliability of the transfer device 100A are improved. In addition, the transfer speed can be increased.

Although there has been described the case where the extensible/contractible unit of the transfer device 100A includes the shaft body 177b the head 177c, and the bellows 177d, the present disclosure is not limited thereto, and the extensible/contractible unit may be an extensible/contractible sack that is disposed to enclose the through-hole 177f.

Further, in the transfer device 100A, the intermediate arm 130 is an example of a structure body; the tip end arm 140 is an example of an arm; and the second communication passage 175 and the volume adjusting unit 177 are an example of a pressure adjusting unit.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

In the above-described embodiment, the case where the vacuum seal structure is uniaxial has been described. However, the present disclosure is not limited thereto. For example, the vacuum seal structure may be biaxial.

What is claimed is:

1. A transfer device disposed in a vacuum transfer chamber, comprising:
 a structure body having an inner space isolated from the vacuum transfer chamber;
 an arm that rotates with respect to the structure body; and
 a vacuum seal structure configured to airtightly seal a sliding portion between the structure body and the arm, wherein the vacuum seal structure includes:
  one or more seal members disposed at the sliding portion;
  a sealing portion formed by the structure body, the arm, and the one or more seal members, lubricant being sealed in the sealing portion; and
  a pressure adjusting unit configured to adjust a pressure in the sealing portion.

2. The transfer device of claim 1, wherein the pressure adjusting unit includes a communication passage having one end communicating with the sealing portion and another end communicating with the inner space of the structure body.

3. The transfer device of claim 2, wherein the communication passage includes a folded portion that is folded up in a vertical direction.

4. The transfer device of claim 3, wherein at least a part of the folded portion is disposed above an upper end of the sealing portion.

5. The transfer device of claim 2, wherein the inner space of the structure body is maintained in an atmospheric environment.

6. The transfer device of claim 2, further comprising:
 a driving unit disposed in the inner space of the structure body to rotate the arm.

7. The transfer device of claim 2, wherein the lubricant is vacuum grease.

8. The transfer device of claim 1, wherein the pressure adjustment unit includes:
 a communication passage having one end communicating with the sealing portion and an other end communicating with the vacuum transfer chamber; and
 a volume adjusting unit disposed at the other end of the communication passage to adjust a volume of the communication passage.

9. The transfer device of claim 8, wherein the volume adjustment unit includes:
 a cap member that airtightly closes the other end of the communication passage and has a through-hole; and
 an extensible/contractible unit that encloses the through-hole.

10. The transfer device of claim 9, wherein the extensible/contractible unit includes:
 a shaft body having one end inserted into the through-hole;
 a head connected to the other end of the shaft body; and
 a bellows that encloses the shaft body and has one end connected to the cap member and the other end connected to the head.

11. The transfer device of claim 8, wherein the inner space of the structure body is maintained in an atmospheric environment.

12. The transfer device of claim 8, further comprising:
 a driving unit disposed in the inner space of the structure body to rotate the arm.

13. The transfer device of claim 8, wherein the lubricant is vacuum grease.

14. The transfer device of claim 1, wherein the inner space of the structure body is maintained in an atmospheric environment.

15. The transfer device of claim 1, further comprising:
 a driving unit disposed in the inner space of the structure body to rotate the arm.

16. The transfer device of claim 1, wherein the lubricant is vacuum grease.

* * * * *